(12) United States Patent
Smith et al.

(10) Patent No.: US 12,237,278 B2
(45) Date of Patent: Feb. 25, 2025

(54) ACTIVE PROTECTION CIRCUITS FOR SEMICONDUCTOR DEVICES

(71) Applicant: Micron Technology, Inc., Boise, ID (US)

(72) Inventors: Michael A. Smith, Boise, ID (US); Kenneth W. Marr, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 41 days.

(21) Appl. No.: 18/142,992

(22) Filed: May 3, 2023

(65) Prior Publication Data

US 2023/0275042 A1 Aug. 31, 2023

Related U.S. Application Data

(62) Division of application No. 17/103,447, filed on Nov. 24, 2020, now Pat. No. 11,676,917.

(51) Int. Cl.
| | |
|---|---|
| *H01L 23/60* | (2006.01) |
| *H10B 41/27* | (2023.01) |
| *H10B 41/41* | (2023.01) |
| *H10B 43/27* | (2023.01) |
| *H10B 43/40* | (2023.01) |

(52) U.S. Cl.
CPC ............. *H01L 23/60* (2013.01); *H10B 41/27* (2023.02); *H10B 41/41* (2023.02); *H10B 43/27* (2023.02); *H10B 43/40* (2023.02)

(58) Field of Classification Search
None
See application file for complete search history.

(56) References Cited

U.S. PATENT DOCUMENTS

| | | |
|---|---|---|
| 6,392,860 B1 | 5/2002 | Lin et al. |
| 2005/0002232 A1 | 1/2005 | Cernea |
| 2007/0103192 A1 | 5/2007 | Madurawe |

(Continued)

FOREIGN PATENT DOCUMENTS

WO 2018236362 A1 12/2018

OTHER PUBLICATIONS

International Application No. PCT/US2021/058967—International Search Report and Written Opinion, dated Mar. 7, 2022, 13 pages.

*Primary Examiner* — Hsien Ming Lee
(74) *Attorney, Agent, or Firm* — Perkins Coie LLP

(57) ABSTRACT

Active protection circuits for semiconductor devices, and associated systems and methods, are disclosed herein. The active protection circuits may protect various components of the semiconductor devices from process induced damage—e.g., stemming from process charging effects. In some embodiments, the active protection circuit includes an FET and a resistor coupled to certain nodes (e.g., source plates for 3D NAND memory arrays) of the semiconductor devices, which may be prone to accumulate the process charging effects. The active protection circuits prevent the nodes from reaching a predetermined voltage during process steps utilizing charged particles. Subsequently, metal jumpers may be added to the active protection circuits to deactivate the FETs for normal operations of the semiconductor devices. Further, the FET and the resistor of the active protection circuit may be integrated with an existing component of the semiconductor device.

12 Claims, 5 Drawing Sheets

(56) References Cited

U.S. PATENT DOCUMENTS

| | | | |
|---|---|---|---|
| 2016/0322345 A1* | 11/2016 | Lee | H01L 27/0292 |
| 2018/0308541 A1 | 10/2018 | Liaw | |
| 2021/0319827 A1 | 10/2021 | Marr et al. | |
| 2022/0149199 A1 | 5/2022 | Smith | |
| 2022/0165688 A1 | 5/2022 | Smith et al. | |

* cited by examiner

ACTIVE PROTECTION CIRCUITS FOR SEMICONDUCTOR DEVICES

CROSS-REFERENCE TO RELATED APPLICATION(S)

This application is a division of U.S. patent application Ser. No. 17/103,447, filed Nov. 24, 2020, now U.S. Pat. No. 11,676,917; which is incorporated herein by reference in its entirety.

TECHNICAL FIELD

The present technology generally relates to semiconductor devices, and more particularly relates to active protection circuits for semiconductor devices.

BACKGROUND

Semiconductor devices are widely used to store information related to various electronic devices such as computers, wireless communication devices, cameras, digital displays, and the like. Information is stored by programing different states of a memory cell. Various types of semiconductor memory devices exist, such as non-volatile memory devices (e.g., NOR flash memory devices, 3-dimensional NAND flash memory devices, etc.) and volatile memory devices (e.g., dynamic RAM (DRAM), synchronous dynamic RAM (SDRAM), etc.).

Improving memory devices, generally, may include increasing memory cell density, increasing read/write speeds or otherwise reducing operational latency, increasing reliability, increasing data retention, reducing power consumption, reducing areas occupied by integrated circuitry, or reducing manufacturing costs, among other metrics. One way of reducing manufacturing costs is to improve manufacturing processes to increase the margin of successfully manufactured devices. Manufacturers can improve the manufacturing margin by implementing processes that, for example, increase the consistency or tolerance of manufacturing steps (e.g., removal or deposition of materials), improve the scale of manufacturing, reduce variability among memory cells, reduce damages to various circuit components, etc.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

DETAILED DESCRIPTION

Figure 1A:
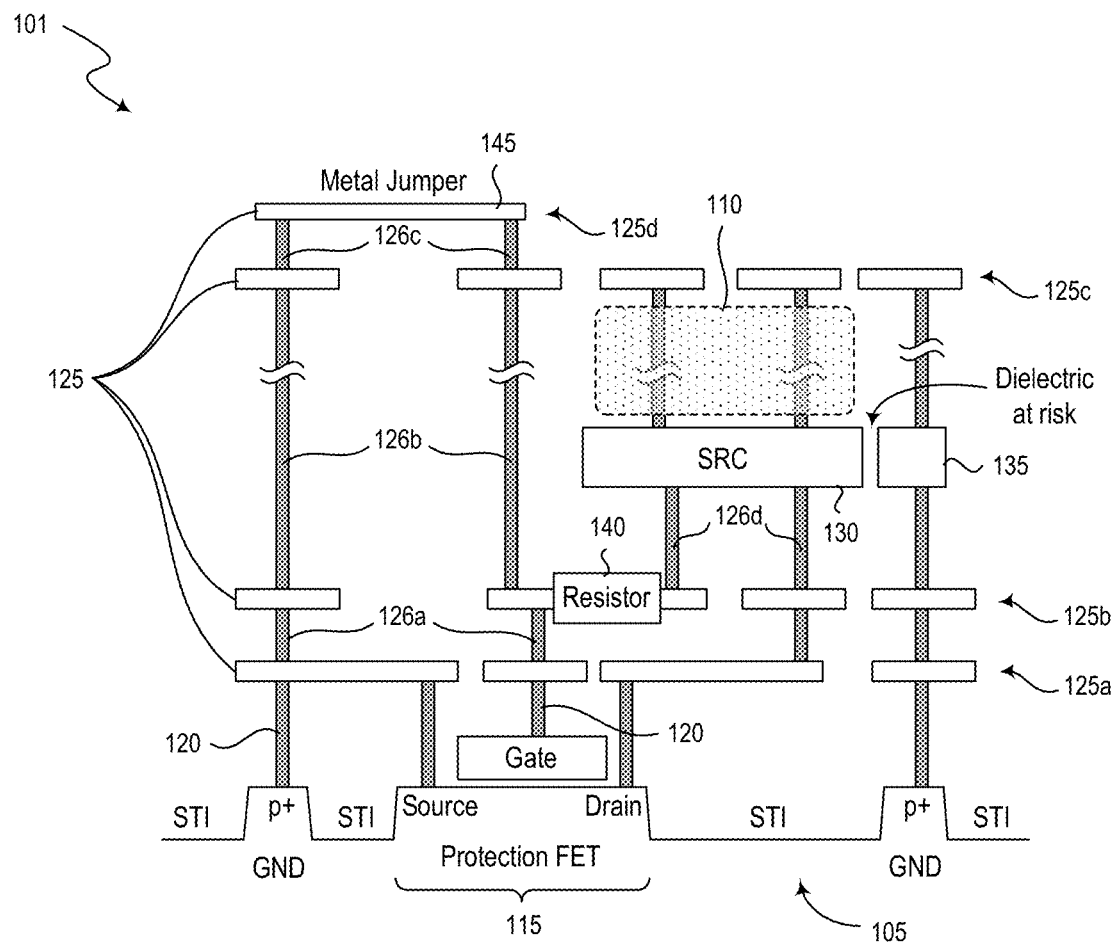
FIG. 1A is a schematic cross-sectional diagram of a semiconductor device in accordance with embodiments of the present technology.

Embodiments of the present technology include protection circuits for semiconductor devices—e.g., 3-dimensional (3D) NAND memory devices. Various components of the semiconductor devices may be subject to risks associated with process induced damages (PIDs), which may occur during one or more process steps, such as plasma etch process, plasma enhanced chemical vapor deposition (PECVD) process, ion implantation process, chemical mechanical polishing (CMP) process, nano-spray process, or the like. In certain process steps involving charged particles in plasma environments (e.g., plasma etch process, PECVD process), some nodes of the semiconductor devices may attain different electrical potential than other nodes, which may be referred to process charging effects. Typically, the process charging effects may be prominent for relatively large conductive features coupled to other features being processed under the plasma environment. In this regard, if the large conductive features are electrically isolated, the electrical potential of the large conductive features may increase during the process steps such that the electrical potential may damage dielectric material around the large conductive features and/or deteriorate critical components (e.g., gate dielectrics) of other circuits of the semiconductor devices.

In certain memory devices (e.g., 3D NAND memory), a large quantity of memory cells may be organized in a memory array (or a memory sector, a memory region, etc.). The memory array may be coupled to a common node such that certain operating voltages may be concurrently applied to the memory cells of the memory array. For example, a plurality of 3D NAND memory cells may be coupled to a source plate providing a common node to the 3D NAND memory cells. During an erase operation, an erase voltage (e.g., around 25 V or so) may be routed to the source plate such that the 3D NAND memory cells coupled to the source plate can be concurrently erased.

The source plate, however, may be formed (e.g., patterned and isolated until all the process steps are completed) earlier than the memory cells and may be subject to the process charging while the memory cells coupled thereto are fabricated. In some cases, the process charging induced potential developed at the source plate may become large enough to damage dielectric materials located between the source plate and a grounded node nearby—e.g., through a dielectric breakdown. In some cases, the source plate is coupled to an isolation component of the memory device, which is configured to couple the erase voltage to the source plate during the erase operation. The isolation component is further configured to couple bit lines of the memory array to corresponding page buffers during read/write operations. The read/write operations may be carried out at a relatively lower voltage (e.g., around 2 V or so) than the erase voltage and the isolation component may include a gate dielectric material (which may be referred to as thin gate oxides) supporting the relatively lower voltage for efficient circuit operations. Accordingly, the process charging induced potential at the source plate may deteriorate (or even destroy) the thin gate oxides of the isolation component rendering the semiconductor device non-functional.

Protection circuits in accordance with the present technology provide an active network including an active component (e.g., field effect transistor (FET)) coupled with a passive component (e.g., a resistor). The active network (or the active protection circuit) is configured to prevent the source plate (or any nodes subject to the process induced charging) from reaching a predetermined voltage during process steps fabricating the memory cells (or features coupled to the nodes). Further, the active network is configured to deactivate the active component after completing the memory cells such that the active protection circuit does not interfere with normal memory operations of the semiconductor device. For example, the isolation component can route the erase voltage to the source plate although the active protection circuit is coupled to the source plate. In this regard, a value of the resistor of the active protection circuit may be determined to prevent the source plate from attaining the predetermined voltage during the processing steps, but not to draw inadequate amount of current from the source plate during normal operations (e.g., the erase operation).

Further, the active protection circuit may be integrated into existing layout of the isolation component to provide efficient protection for the isolation component against the adverse effects of the process induced charging such that modifications to existing design of the isolation component may be maintained to be minimal. In this regard, integrating the active protection circuit may be accomplished without an increase in die size and/or dispensing significant design resources as described in more details herein. Various features and variations of the isolation component are also described in a pending U.S. application Ser. No. 17/095,475, filed on Nov. 11, 2020, and incorporated in its entirety herein by reference.

FIG. 1A is a schematic cross-sectional diagram 101 of a semiconductor device in accordance with embodiments of the present technology. The diagram 101 illustrate a substrate 105 including a protection FET 115, multiple levels of interconnect structures including contacts 120, conductive traces 125 (also identified individually as 125a through 125d) and vias 126 (also identified individually as 126a through 126c) disposed between the conductive traces 125. Further, the diagram 101 illustrates a source plate 130, a memory array 110 including a plurality of memory cells, a resistor 140, and a metal jumper 145.

The diagram 101 generally depicts sequences of process steps fabricating the semiconductor device (except the resistor 140, in some embodiments). In this regard, features located closer to the substrate 105 are fabricated earlier than features located farther from the substrate 105. For example, the protection FET 115 is formed earlier than the source plate 130, which is formed earlier than the memory array 110. Accordingly, the metal jumper 145 may be formed after the memory array 110. In some embodiments, the resistor 140 includes conductive traces—e.g., elongated conductive trace 125b as depicted in FIG. 1A. In some embodiments, however, the resistor 140 includes an active area in the substrate 105 (e.g., a diffusion resistor including one or more dopant species). In such embodiments, the resistor 140 can be formed before the contacts 120, and coupled to the source plate 130 and the gate of the protection FET 115 through the interconnect structures.

The source plate 130 provides a common node for the memory cells of the memory array 110. For example, during an erase operation for the memory array 110, an erase voltage may be routed to the source plate 130 such that the memory cells coupled to the source plate 130 may be concurrently erased.

During the process steps of making the semiconductor device, the memory array 110 may be formed over the source plate 130 that has been formed (e.g., patterned and isolated if the active protection circuit is absent). As such, while the memory array 110 is formed (e.g., using one or more plasma etch process steps), the source plate 130 may be charged to certain voltage. In some embodiments, a grounded node 135 may be present next to the source plate 130 as depicted in FIG. 1A. Thus, a dielectric material separating the source plate 130 and the grounded node 135 may be subject to an electrical stress due to the voltage developed at the source plate 130. In some cases, the dielectric material at risk may be deteriorated to pose reliability risks or may breakdown to cause a short between the source plate 130 and the grounded node 135 rendering the semiconductor device non-functional.

The protection FET 115 is located in active areas of the substrate 105. The active areas of the substrate 105 (e.g., a silicon substrate, in which the semiconductor devices are fabricated) surrounded by dielectric materials providing electrical isolations among active areas of the substrate 105—e.g., dielectric materials in shallow trench isolation (STI) features in the substrate 105, which may be referred to as field regions. Further, the active areas may include one or more dopant species that modify electrical and/or material characteristics of the active areas. As such, the active areas may be referred to as diffusion areas and/or diffusion regions. For example, the active areas may form source, channel, drain, and/or lightly-doped drain (LDD) regions of field-effect transistors by selectively introducing one or more dopant species in various portions of the active areas. Further, active areas of the substrate 105 may include other components of the semiconductor device, such as diffusion resistors, wells, ground nodes, or the like.

The protection FET 115 includes a drain coupled to the source plate 130, a source coupled to a ground node (GND) of the substrate 105, and a gate coupled to a first node of the resistor 140. A second node of the resistor 140 is coupled to the source plate 130. Further, the gate of the protection FET 115 can be coupled to the ground node (GND) when the metal jumper 145 is formed—e.g., after the memory array 110 is formed. In some embodiments, the protection FET 115 is an n-channel metal-oxide-semiconductor (MOS) FET. Accordingly, the source and drain of the protection FET 115 may be doped with n-type dopants, such as phosphorus, arsenic or other suitable n-type dopants—e.g., dopants exhibiting negative polarity when ionized. Similarly, the ground node may be doped with p-type dopants, such as boron, indium, or other suitable p-type dopants—e.g., dopants exhibiting positive polarity when ionized.

The protection FET 115 and the resistor 140, in combination, are configured to prevent the source plate 130 from reaching a predetermined voltage (e.g., around 3 V or so) during process steps fabricating the memory cells of the memory array 110. In this regard, the drain and source of the protection FET 115 are coupled to the source plate 130 and the ground node (GND), respectively, through interconnect components located below a plane coplanar with the source plate 130—e.g., the contacts 120, the conductive trace 125a (e.g., metal 1), the vias 126a, the conductive trace 125b (e.g., metal 2), and vias 126d.

In this manner, the active protection ckt including the protection FET 115 and the resistor 140 is completed to be functional and in place to couple the source plate 130 to the ground node during the process steps fabricating the memory array 110. By way of example, the voltage of the source plate 130 (e.g., due to the process induced charging effect) can be passed, through the resistor 140, to the gate of the protection FET 115. As such, the resistor 140 may be referred to as a pull-up resistor. If the voltage passed to the gate of the protection FET 115 is greater than a threshold voltage of the protection FET 115, the protection FET 115 turns on to couple the drain (coupled to the source plate 130) to the source (coupled to the ground node) such that the voltage at the source plate 130 can be reduced. In some embodiments, the voltage at the source plate 130 may be predetermined not to exceed 3V or so.

Further, the resistor 140 and the metal jumper 145, in combination, are configured to deactivate the protection FET 115 and isolate the source plate 130 from the ground node (GND) during operations of the semiconductor device. In this regard, the metal jumper 145 corresponds to one or more interconnect components located above a plane coplanar with the memory array 110—e.g., conductive trace 125c (e.g., metal 3), vias 126c, and conductive trace 125d (e.g., metal 4). In some embodiments, the metal jumper 145 corresponds to the conductive trace 125d. By way of example, once the metal jumper 145 is completed, the gate of the protection FET 115 is coupled to the ground, thereby deactivating the protection FET 115. The source plate 130, however, is coupled to the ground node through the resistor 140 and the metal jumper 145. As such, the resistance value of the resistor 140 may be determined to be adequate (e.g., small enough) for effectively passing the voltage from the source plate 130 to the gate of the protection FET 115 during process steps for forming the memory array 110. Also, the resistance value of the resistor 140 would need to be adequate (e.g., large enough) not to draw undue amount of leakage current from the source plate 130 (e.g., during erase operation).

The resistor 140 may include the conductive trace 125b as depicted in FIG. 1A—e.g., an elongated conductive trace 125b. In other embodiments, the resistor 140 may include an elongated active area including one or more dopant species (e.g., n-type dopants, p-type dopants). Further, the resistor 140 may include an elongated gate over at least a portion of the elongated active area, where the elongated gate is coupled to the gate of the protection FET 115. In some embodiments, the diffusion resistor (e.g., lightly doped with n-type dopants) pass 5V to 10V from the source plate 130 to the gate of the protection FET 115. In some embodiments, the diffusion resistor the gate over the active area may pass 3V to 4V from the source plate 130 to the gate of the protection FET 115. In some embodiments, the resistor 140 includes the elongated active area partially covered by the gate—e.g., having a first portion of the elongated active area covered by the gate and a second portion of the elongated active area uncovered by the gate. In some embodiments, the resistor 140 is approximately 250 mega-ohm (MOhm). In other embodiments, the resistance of the resistor 140 may vary from approximately 2 MOhm (e.g., 2 MOhm±5%, 2 MOhm±10%, or the like) to approximately 500 MOhm (e.g., 500 MOhm±5%, 500 MOhm±10%, or the like).

Figure 1B:
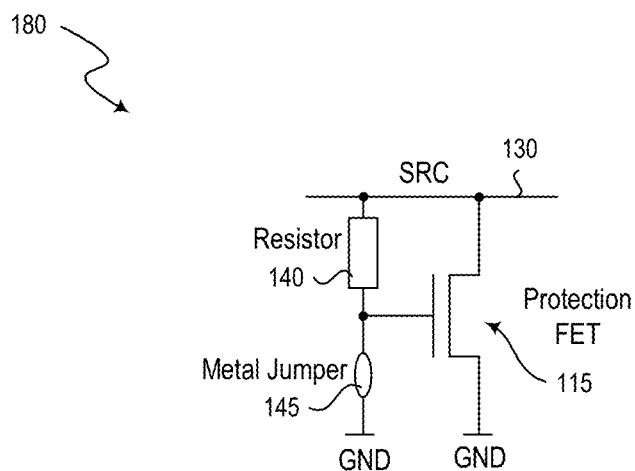
FIG. 1B is a diagram of an active protection circuit for semiconductor devices in accordance with embodiments of the present technology.

FIG. 1B is a diagram 180 of an active protection circuit for semiconductor devices in accordance with embodiments of the present technology. The diagram 180 may be regarded as an equivalent circuit of the active protection circuit illustrated in the diagram 101. As described above with reference to the diagram 101 of FIG. 1A, during the process steps for fabricating the memory array 110, the metal jumper 145 does not exist. Thus, the active protection circuit includes the protection FET 115 and the resistor 140. As the resistor 140 is disposed between the source plate 130 and the gate of the protection FET 115, the voltage of the source plate 130 can be "passed" to the gate of the protection FET 115. When the protection FET 115 turns on, the source plate 130 is coupled to the ground node to shunt the voltage developed at the source plate 130 to the ground. As such, the resistance value of the resistor 140 may be devised to be sufficiently small to pass the voltage from the source plate 130 to the gate of the protection FET 115. In this manner, the active protection circuit can prevent the source plate 130 from reaching a predetermined voltage during the process steps.

Once the process steps to fabricate the memory device is complete, the metal jumper 145 is in place to deactivate the protection FET 115 by grounding the gate of the protection FET 115 such that the protection FET 115 does not interfere with normal operations of the memory device. Instead, the source plate is coupled to the ground node through the resistor 140 and the metal jumper 145. As such, the resistance value of the resistor 140 may be devised to be sufficiently large to prevent excessive leakage between the source plate 130 and the ground node during normal operations of the memory device (e.g., erase operation).

Figure 2A:
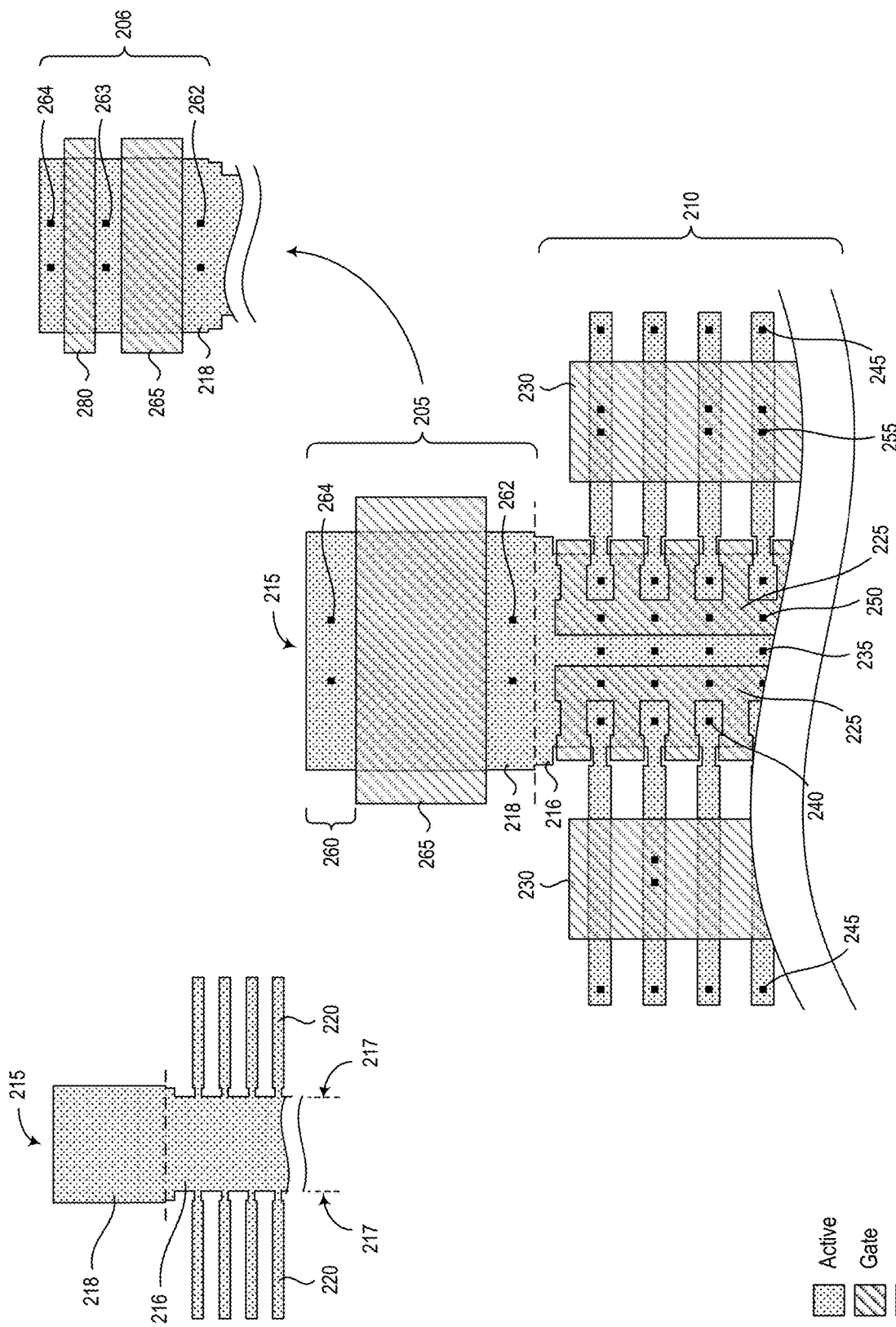
FIGS. 2A and 2B are layouts of active protection circuits for semiconductor devices in accordance with embodiments of the present technology.
Figure 2B:
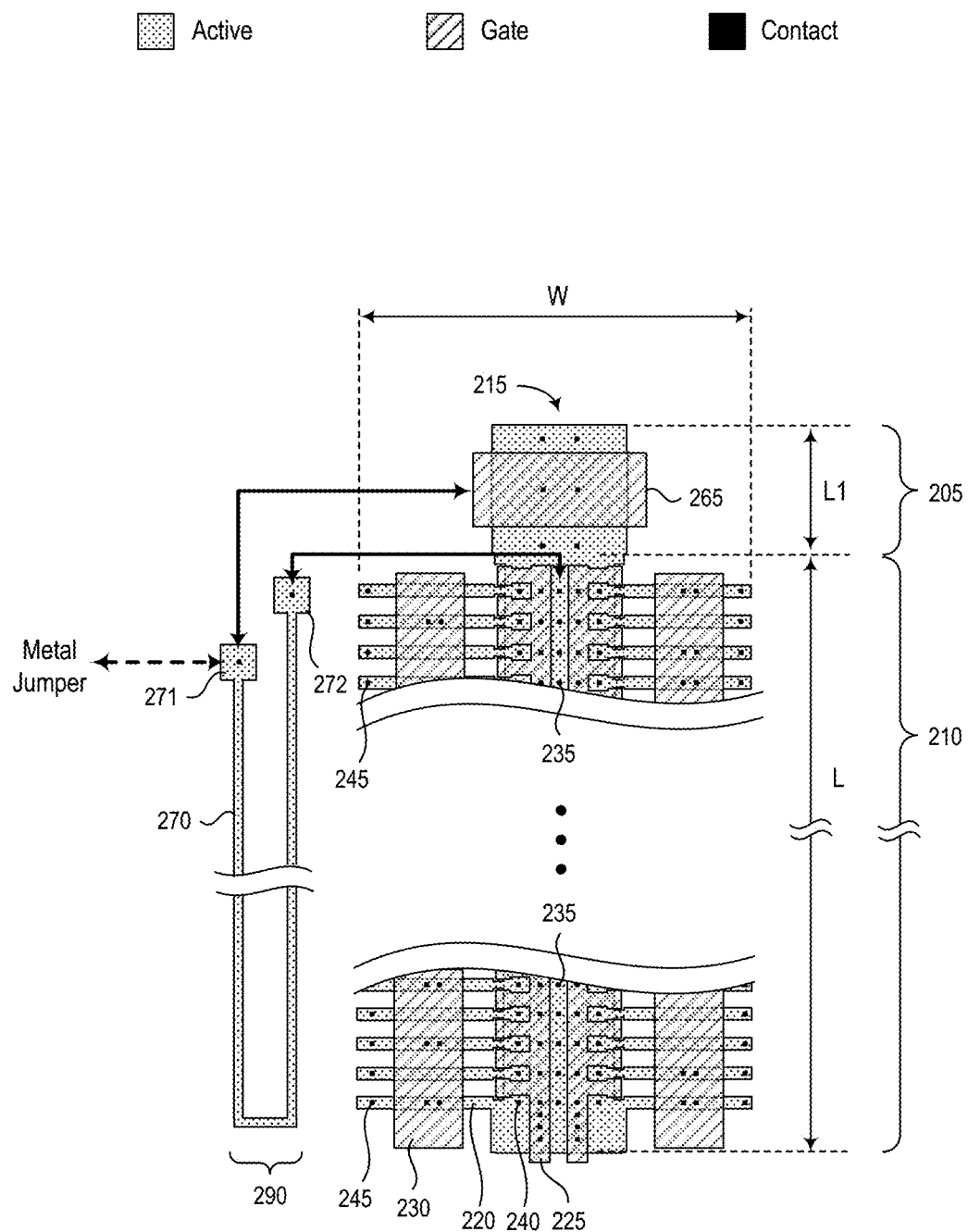

FIGS. 2A and 2B are layouts of active protection circuits for semiconductor devices (e.g., semiconductor memory devices) in accordance with embodiments of the present technology. FIG. 2A illustrates a protection FET 205 integrated (e.g., conjoined) with an isolation component 210. The protection FET 205 may be an example of or include aspects of the protection FET 115 described with reference to FIGS. 1A and 1B. Further, FIG. 2A separately depicts a layout of an active layer 215 that is common to the protection FET 205 and the isolation component 210 without any obfuscation by other layers overlaid over it—e.g., gate and/or contact layers. Additionally, FIG. 2A illustrate an optional layout of the protection FET 205 (denoted as a protection FET 206) as described in more detail herein. FIG. 2B illustrates the resistor (e.g., the resistor 140) and the metal jumper (e.g., the metal jumper 145) of the active protection circuit while FIG. 2A omits the resistor and the metal jumper for clarity of illustration.

FIG. 2A illustrates a portion of the isolation component 210 that includes a first active area 215 extending in a first direction (e.g., a direction along the length L depicted in FIG. 2B). In some embodiments, the length L may vary between approximately 1,000 micrometers (μm) to approximately 10,000 μm. The first active area 215 includes a first portion 216 where source contacts 235 are located along the first direction. The source contacts 235 are coupled to the source plate (e.g., the source plate 130) that is further coupled to the memory array (e.g., the memory array 110). The first portion 216 has edges 217, to which a set of active channels 220 is connected. Each one of the active channels 220 is aligned with a corresponding bit line contact 240 of the first portion 216 and extends in a second direction (e.g., a direction along the width W depicted in FIG. 2B) orthogonal to the first direction. Individual bit line contacts 240 are coupled to corresponding bit lines of the memory array. A subset of active channels 220 extends toward the resistor (the second active area 270 as shown in FIG. 2B), and is located between the resistor and the bit line contacts 240. Further, each one of the active channels 220 includes an end portion where a contact 245 is located. Individual contacts 245 are coupled to corresponding page buffers for the memory array of the semiconductor device.

The isolation component 210 includes a first gate 225 located between the source contacts 235 and the bit line contacts 240. The isolation component 210 also includes a second gate 230 over the active channels 220 between the contacts 245 and the bit line contacts 240. During a first operation of the semiconductor device under a relatively low voltage (LV)—e.g., LV operations, read/write operations, the first gate 225 may be turned off (e.g., grounded, deactivated) to decouple the source contacts 235 from the bit line contacts 240. Further, the second gate 230 may be turned on (e.g., activated) to couple the bit line contacts 240 to the contacts 245. In this manner, individual bit lines of the memory array (coupled to the bit line contacts 240) can be coupled to corresponding page buffers (coupled to the contacts 245) either to read data from the memory cells of the bit lines to the page buffers or the write data from the page buffers to the memory cells of the bit lines. In some embodiments, the low voltage may correspond to approximately 2.4V (e.g., 2.4V±5%, 2.4V±10%, or the like) to support various operations specified in the datasheets of the memory device. Under certain operating conditions (e.g., test operations), the low voltage may reach approximately 3.3V (e.g., 3.3V±5%, 3.3V±10%, or the like). In some embodiments, the page buffers includes FETs with thin gate oxides (e.g., gate oxides with a thickness ranging from approximately 5.5 nm to approximately 8 nm) in view of the low voltage during the LV operations (e.g., 3.3V operations).

During a second operation of the semiconductor device under a relatively high voltage (HV)—e.g., HV operations, erase operations, the high voltage (e.g., an erase voltage of approximately 15V to approximately 25V) may be applied to the source contacts 235. In some embodiments, the high voltage may vary between approximately 10V (e.g., 10V±5%, 10V±10%, or the like) to approximately 35V (e.g., 35V±5%, 35V±10%, or the like). The first gate 225 may be turned on to couple the source voltage of the source contacts 235 to the bit line contacts 240 such that the erase voltage may be passed on to the memory array. Further, the second gate 230 may be turned off (e.g., grounded, deactivated) to decouple the bit line contacts 240 from the contacts 245 to isolate the high voltage from the contacts 245 (thus, from the page buffers coupled thereto). In this manner, individual bit lines of the memory array can be coupled to the erase voltage while the page buffers are isolated from the erase voltage. In some embodiments, the isolation component 210 includes thick gate oxides (e.g., under the first gate 225) in view of the high voltage during the HV operations—e.g., the thickness of such thick gate oxides ranging from approximately 35 nanometers (nm) to approximately 45 nm.

The first active area 215 also includes a second portion 218 that is contiguous to the first portion 216. The first active area 215 corresponds to the protection FET 205. The second portion 218 does not have source contacts 235. Instead, the protection FET 205 includes its drain contacts 262. As the source contacts 235 of the isolation component 210 and the drain contacts 262 of the protection FET 205 share the same active area, the drain of the protection FET 205 is tied to (connected to) the source contacts 235 of the isolation component 210, which in turn are connected to the source plate. Further, the protection FET 205 includes a first gate 265 over the second portion 218 with a section 260 of the second portion 218 uncovered by the first gate 265. The section 260 is located away from the first portion 216 and configured (with source contacts 264) to function as a source of the protection FET 205, which is coupled with a ground node of the semiconductor device.

FIG. 2A illustrates an optional layout of the protection FET 205, denoted as a protection FET 206. The protection FET 206 includes two gates (e.g., the gate 265 and another gate 280 over the second portion 218). As such, the protection FET 206 may be regarded to include two FETs serially connected, namely a first FET with the gate 265 and a second FET with the gate 280, which may be referred to as a cascode configuration. In some embodiments, the first and second FETs include a common gate oxide (e.g., a thin gate oxide, a thick gate oxide). In other embodiments, the first and second FETs include different gate oxides—e.g., the first FET with the gate 265 having a thick gate oxide and the second FET with the gate 280 having a thin gate oxide, or vice versa. In this regard, the protection FET 206 may be regarded as the protection FET 205 having the second FET with the gate 280 attached thereto—e.g., having a third active area of the second FET adjacent to the second portion 218 of the first active area 215, over which the gate 280 is disposed.

FIG. 2B illustrates the protection FET 205, the isolation component 210, and the resistor 290 of the active protection circuit in accordance with embodiments of the present technology. Although FIG. 2B shows the protection FET 205, the active protection circuit may include the protection FET 206 (the protection FETs in a cascode configuration) instead of the protection FET 205.

The resistor 290 illustrated in FIG. 2B is a diffusion resistor including one or more dopant species. As such, the resistor 290 includes a second active area 270 located proximate to a side of the first active area 215. The second active area 270 includes at least one elongated segment extending in the first direction, and a first end portion 271 and a second end portion 272 of the second active area 270 are located proximate to the second portion 218 of the first active area 215. Further, the first end portion 271 is coupled to the gate 265 of the protection FET 205, and the second end portion 272 is coupled to source contacts 235, respectively. Moreover, the resistor 290 may include a gate over at least a portion of the second active area, and the gate may be coupled to the gate 265 of the protection FET 205 (or one of the gates 265/280 of the protection FET 206, e.g., the gate 280 of the protection FET 206).

Further, in some embodiments, the first portion 216 of the first active area 215 has a first length (e.g., length L) in the first direction. In some embodiments, the length L may be several thousand micrometers (μm), or even greater. In some embodiments, a second length (e.g., length L1) of the second portion may be less than one hundred (100) micrometers. The second active area 270 includes a first leg of active area extending from the first end portion 271 in the first direction, and the first leg has a second length less than or approximately equal to the first length. The second active area 270 also includes a second leg of active area extending from the second end portion 272 in the first direction, the second leg having a third length approximately same as the second length. Moreover, as depicted in FIG. 2B, the second active area 270 includes a u-shaped active area connecting the first leg and the second leg, where the u-shaped active area is located opposite to the first and second end portions 271/272.

After the process steps fabricating the memory array, a metal jumper (e.g., the metal jumper 145) may be connected to the first end portion 271 of the second active area 270 such that the metal jumper can couple the first end portion 271 with the ground node of the semiconductor device. The metal jumper, once connected to the first end portion 271, couples the gate 265 of the protection FET 205 to the ground node, thereby deactivating the protection FET 205 as described herein with reference to FIGS. 1A and 1B.

Figure 3:
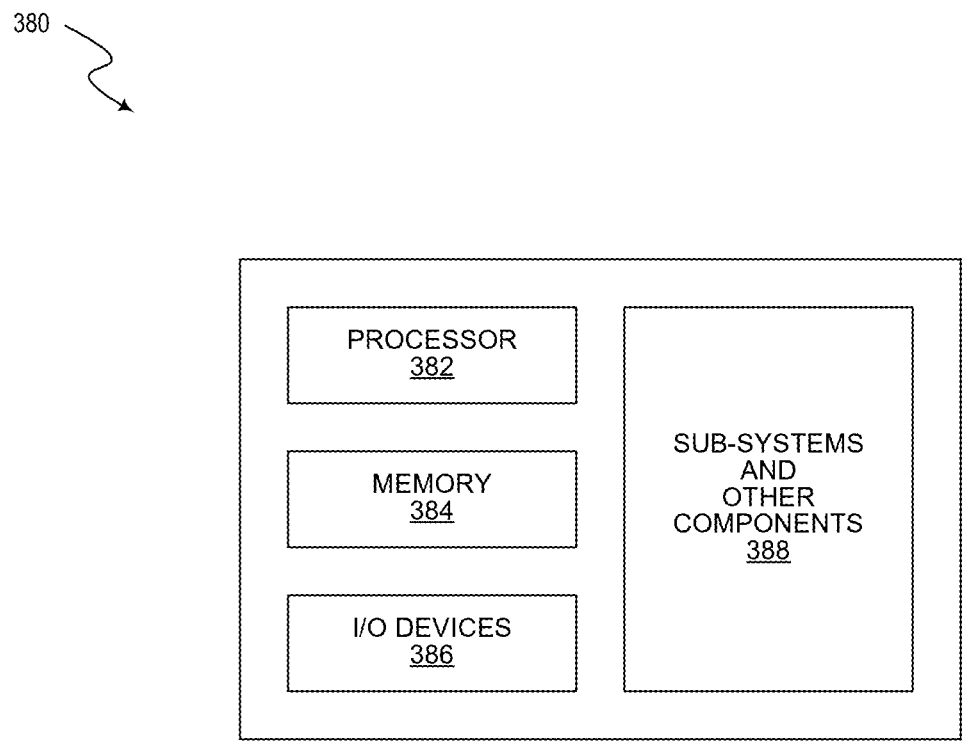
FIG. 3 is a schematic view of a system that includes memory devices with active protection circuits in accordance with embodiments of the present technology.

The memory devices described in detail above with reference to FIGS. 1A through 2B or packages incorporating such a memory device can be incorporated into any of a myriad of larger and/or more complex systems, a representative example of which is a system 380 shown schematically in FIG. 3. The system 380 can include a processor 382, a memory 384 (e.g., SRAM, DRAM, flash, 3D NAND, 3D cross-point and/or other memory devices), input/output devices 386, and/or other subsystems or components 388. For example, the memory 384 may include the active protection circuits described with reference to FIG. 1A through 2B. As such, the memory devices of the memory 384 can include protection FETs integrated with isolation components coupled to source plates. Further, the protection FETs is coupled to resistors, prior to the process steps fabricating the memory array to provide protection against process charging damage. After the process steps for the memory array are completed, the metal jumpers formed to couple the gates of the protection FETs such that the protection FETs are deactivated during normal operations of the memory devices. The memory devices and/or packages incorporating such memory devices can be included in any of the elements shown in FIG. 3.

The resulting system 380 can be configured to perform any of a wide variety of suitable computing, processing, storage, sensing, imaging, and/or other functions. Accordingly, representative examples of the system 380 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 380 include lights, cameras, vehicles, etc. With regard to these and other example, the system 380 can be housed in a single unit or distributed over multiple interconnected units, for example, through a communication network. The components of the system 380 can accordingly include local and/or remote memory storage devices and any of a wide variety of suitable computer-readable media.

Figure 4:
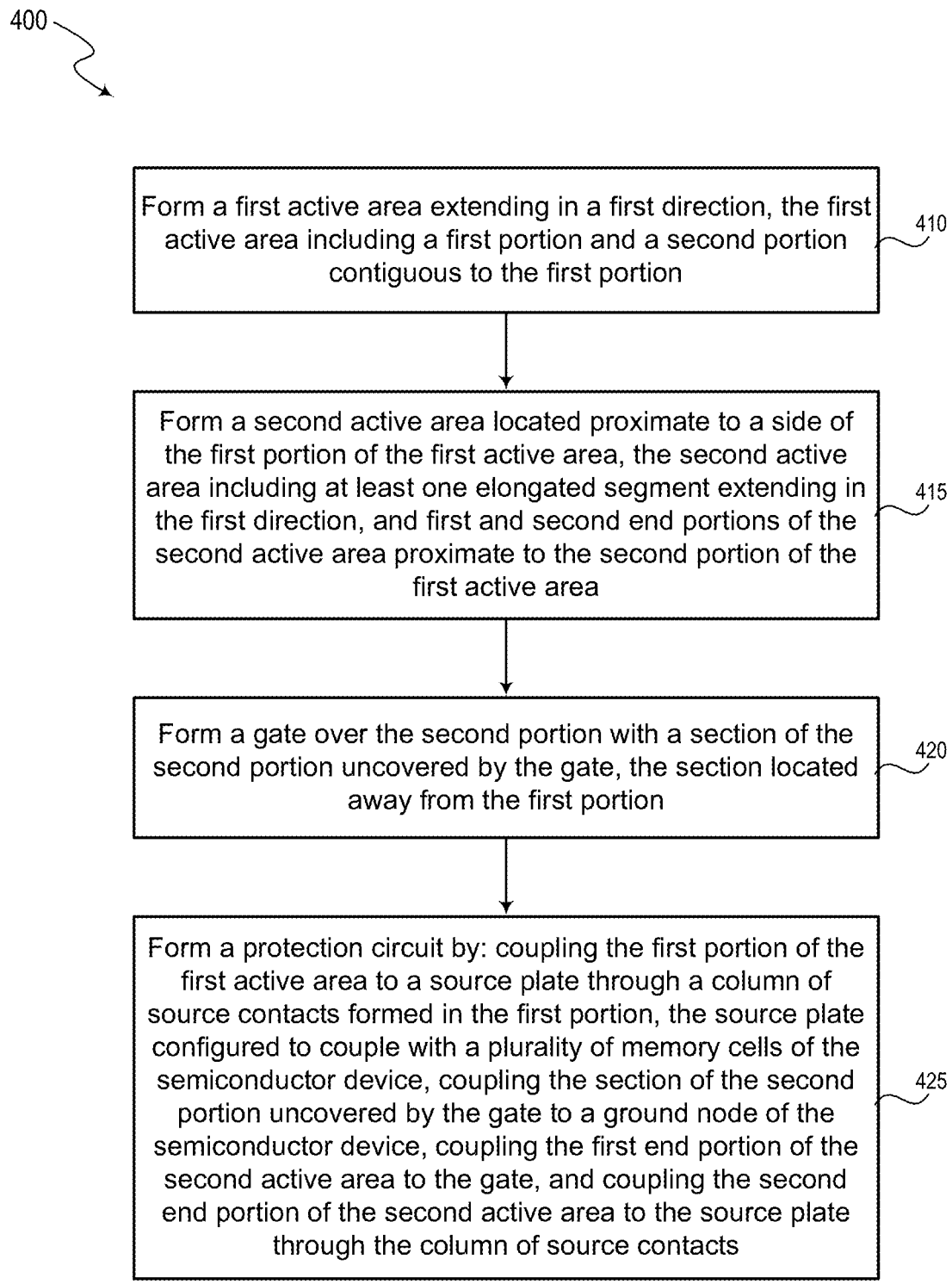
FIG. 4 is a flowchart of a method for making a semiconductor device including an active protection circuit in accordance with embodiments of the present technology in accordance with embodiments of the present technology.

FIG. 4 is a flowchart 400 of a method for making a semiconductor device including an active protection circuit in accordance with embodiments of the present technology in accordance with embodiments of the present technology. The flowchart 400 may include aspects of methods as described with reference to FIGS. 1A through 2B.

The method includes forming a first active area extending in a first direction, the first active area including a first portion and a second portion contiguous to the first portion (box 410). The method further includes forming a second active area located proximate to a side of the first portion of the first active area, the second active area including at least one elongated segment extending in the first direction, and first and second end portions of the second active area proximate to the second portion of the first active area (box 415). The method further includes forming a gate over the second portion with a section of the second portion uncovered by the gate, the section located away from the first portion (box 420). The method further includes forming a protection circuit by: coupling the first portion of the first active area to a source plate through a column of source contacts formed in the first portion, the source plate configured to couple with a plurality of memory cells of the semiconductor device, coupling the section of the second portion uncovered by the gate to a ground node of the semiconductor device, coupling the first end portion of the second active area to the gate, and coupling the second end portion of the second active area to the source plate through the column of source contacts (box 425).

In some embodiments, the method may further include forming the plurality of memory cells, after forming the protection circuit. In some embodiments, the method may further include forming, after forming the plurality of memory cells, a metal jumper configured to connect the gate coupled with the first end portion of the second active area to the ground node.

It should be noted that embodiments illustrated above describe possible implementations, and that the various schemes of integrating process steps and their sequence for the embodiments may be rearranged or otherwise modified and that other implementations are possible. Furthermore, embodiments from two or more of the modifications may be combined. From the foregoing, it will be appreciated that specific embodiments of the technology have been described herein for purposes of illustration, but that various modifications may be made without deviating from the disclosure. In addition, while in the illustrated embodiments certain features or components have been shown as having certain arrangements or configurations, other arrangements and configurations are possible. Moreover, certain aspects of the present technology described in the context of particular embodiments may also be combined or eliminated in other embodiments.

Although in foregoing example embodiments, active protection circuits of semiconductor devices including 3D NAND flash memory have been described and illustrated, in other embodiments, semiconductor devices may be provided with different types of memory arrays—e.g., 3D cross-point memory, DRAM, resistive memory, magnetic memory, ferroelectric memory, etc. Moreover, the present technology of incorporating the active protection circuits to mitigate risks associated with process charging effects may be applied to semiconductor devices other than memory devices to improve reliability and/or yield of the semiconductor devices by mitigating risks associated with process induced damages.

The devices discussed herein, including a semiconductor device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, indium, or arsenic. Doping may be performed during the initial formation or growth of the substrate, by ion-implantation, or by any other doping means.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A semiconductor device, comprising:
   a first active area extending in a first direction, wherein the first active area includes a first portion with a column of source contacts along the first direction and a second portion contiguous to the first portion;
   a first gate over the second portion with a section of the second portion uncovered by the first gate, the section located away from the first portion and configured to couple with a ground node of the semiconductor device; and
   a second active area located proximate to a side of the first active area, the second active area including at least one elongated segment extending in the first direction and first and second end portions of the second active area proximate to the second portion of the first active area, wherein the first and second end portions of the second active area are coupled with the first gate and the column of source contacts, respectively.

2. The semiconductor device of claim 1, further comprising:
   a metal jumper connected to the first end portion of the second active area, wherein the metal jumper is configured to couple the first end portion with the ground node after a plurality of memory cells of the semiconductor device has been formed.

3. The semiconductor device of claim 1, further comprising:
   a second gate over at least a portion of the second active area, the second gate coupled to the first gate.

4. The semiconductor device of claim 1, wherein the first portion of the first active area has a first length in the first direction, and the second active area includes:
   a first leg of the second active area extending from the first end portion in the first direction, the first leg including the at least one elongated segment and having a second length less than or approximately equal to the first length;
   a second leg of the second active area extending from the second end portion in the first direction, the second leg having a third length approximately same as the second length; and
   a u-shaped active area connecting the first leg and the second leg, the u-shaped active area opposite to the first and second end portions.

5. The semiconductor device of claim 1, further comprising:
   a third active area adjacent to the second portion of the first active area; and
   a second gate over the third active area, wherein the first gate and the second gate are coupled to each other in a cascode configuration.

6. The semiconductor device of claim 1, further comprising:
   a plurality of active channels connected to an edge of the first portion of the first active area, wherein each one of the active channels is aligned with a corresponding bit line contact of the first portion and extends toward the second active area in a second direction orthogonal to the first direction.

7. A method of making a semiconductor device, comprising:
   forming a first active area extending in a first direction, the first active area including a first portion and a second portion contiguous to the first portion;
   forming a second active area located proximate to a side of the first portion of the first active area, the second active area including at least one elongated segment extending in the first direction, and first and second end portions of the second active area proximate to the second portion of the first active area;
   forming a gate over the second portion with a section of the second portion uncovered by the gate, the section located away from the first portion; and
   forming a protection circuit by:
      coupling the first portion of the first active area to a source plate through a column of source contacts formed in the first portion, the source plate configured to couple with a plurality of memory cells of the semiconductor device,
      coupling the section of the second portion uncovered by the gate to a ground node of the semiconductor device,
      coupling the first end portion of the second active area to the gate, and
      coupling the second end portion of the second active area to the source plate through the column of source contacts.

8. The method of claim 7, further comprising:
   forming the plurality of memory cells, after forming the protection circuit.

9. The method of claim 8, further comprising:
   forming, after forming the plurality of memory cells, a metal jumper configured to connect the gate coupled with the first end portion of the second active area to the ground node.

10. The method of claim 7, wherein the gate is a first gate, and wherein the method further comprises:
    forming a second gate over at least a portion of the second active area, the second gate coupled to the first gate.

11. The method of claim 7, wherein the gate is a first gate, and wherein the method further comprises:
    forming a third active area adjacent to the second portion of the first active area; and
    forming a second gate over the third active area, wherein the first gate and the second gate are coupled to each other in a cascode configuration.

12. The method of claim 7, further comprising:
    forming a plurality of active channels connected to an edge of the first portion of the first active area, wherein each one of the active channels is aligned with a corresponding bit line contact of the first portion and extends toward the second active area in a second direction orthogonal to the first direction.

* * * * *